United States Patent
Nakao

(10) Patent No.: US 11,404,627 B2
(45) Date of Patent: Aug. 2, 2022

(54) ACTUATOR AND TACTILE SENSATION PROVIDING APPARATUS

(71) Applicant: KYOCERA Corporation, Kyoto (JP)

(72) Inventor: Fumiaki Nakao, Kawasaki (JP)

(73) Assignee: KYOCERA Corporation, Kyoto (JP)

( * ) Notice: Subject to any disclaimer, the term of this patent is extended or adjusted under 35 U.S.C. 154(b) by 995 days.

(21) Appl. No.: 16/084,316

(22) PCT Filed: Mar. 9, 2017

(86) PCT No.: PCT/JP2017/009614
§ 371 (c)(1),
(2) Date: Sep. 12, 2018

(87) PCT Pub. No.: WO2017/163918
PCT Pub. Date: Sep. 28, 2017

(65) Prior Publication Data
US 2019/0074424 A1    Mar. 7, 2019

(30) Foreign Application Priority Data

Mar. 24, 2016 (JP) .............................. JP2016-060626

(51) Int. Cl.
*H01L 41/09* (2006.01)
*G06F 3/041* (2006.01)
*H02N 2/04* (2006.01)
*G06F 3/01* (2006.01)
*B06B 1/06* (2006.01)
(Continued)

(52) U.S. Cl.
CPC ............ *H01L 41/0906* (2013.01); *B06B 1/06* (2013.01); *G06F 3/01* (2013.01); *G06F 3/016* (2013.01); *G06F 3/041* (2013.01); *H02N 2/0055* (2013.01); *H02N 2/04* (2013.01); *H02N 2/06* (2013.01)

(58) Field of Classification Search
CPC ............ H01L 41/0906; H01L 41/0933; H02N 2/0055; H02N 2/04; H02N 2/06; G06F 3/01; G06F 3/016; G06F 3/041; B06B 1/06
See application file for complete search history.

(56) References Cited

U.S. PATENT DOCUMENTS

| 9,046,947 | B2 | 6/2015 | Takeda et al. |
| 2009/0096326 | A1* | 4/2009 | Onishi ................... H04R 17/00 310/334 |

(Continued)

FOREIGN PATENT DOCUMENTS

| EP | 2202619 A1 | 6/2010 |
| EP | 2202620 A1 | 6/2010 |

(Continued)

*Primary Examiner* — Emily P Pham
(74) *Attorney, Agent, or Firm* — Studebaker & Brackett PC

(57) ABSTRACT

A tactile sensation providing apparatus includes an actuator and an object of vibration configured to provide a tactile sensation to a user by vibration of the vibration plate being transmitted to the object of vibration. The actuator includes a piezoelectric element, a vibration plate, and supports. The vibration plate has the piezoelectric element joined thereto and vibrates in accordance with displacement of the piezoelectric element. The supports support the vibration plate. The angles, when the actuator is not being driven, between the vibration plate and the supports are acute.

8 Claims, 10 Drawing Sheets

(51) Int. Cl.
*H02N 2/00* (2006.01)
*H02N 2/06* (2006.01)

(56) References Cited

U.S. PATENT DOCUMENTS

| | | |
|---|---|---|
| 2013/0215080 A1 | 8/2013 | Takeda et al. |
| 2015/0091414 A1* | 4/2015 | Lonnberg ............ G06F 3/04883 310/330 |
| 2016/0118913 A1* | 4/2016 | Nishitani ............... H02N 2/026 310/323.05 |
| 2018/0188121 A1 | 7/2018 | Ono et al. |

FOREIGN PATENT DOCUMENTS

| | | |
|---|---|---|
| EP | 2202621 A1 | 6/2010 |
| EP | 2207080 A1 | 7/2010 |
| EP | 2202620 B1 | 2/2018 |
| JP | 2010-152889 A | 7/2010 |
| JP | 5452729 B2 | 3/2014 |
| WO | 2015/146116 A1 | 10/2015 |
| WO | 2016/157264 A1 | 10/2016 |

* cited by examiner

ACTUATOR AND TACTILE SENSATION PROVIDING APPARATUS

CROSS-REFERENCE TO RELATED APPLICATION

The present application claims priority to and the benefit of Japanese Patent Application No. 2016-60626 filed Mar. 24, 2016, the entire contents of which are incorporated herein by reference.

TECHNICAL FIELD

The present disclosure relates to an actuator and a tactile sensation providing apparatus.

BACKGROUND

An actuator that generates vibration has been provided in a touch sensor or the like. The actuator is, for example, a unimorph. The actuator vibrates an object of vibration, such as a touch sensor, thereby providing a tactile sensation to a user who touches the object of vibration. For example, large vibration of the actuator is required.

SUMMARY

An actuator according to an embodiment of the present disclosure includes a piezoelectric element, a vibration plate, and a support. The vibration plate has the piezoelectric element joined thereto and is configured to vibrate in accordance with displacement of the piezoelectric element. The support is configured to support the vibration plate. The angle between the vibration plate and the support is acute.

A tactile sensation providing apparatus according to an embodiment of the present disclosure includes an actuator that includes a piezoelectric element, a vibration plate, and a support. The vibration plate has the piezoelectric element joined thereto and is configured to vibrate in accordance with displacement of the piezoelectric element. The support is configured to support the vibration plate. The tactile sensation providing apparatus includes an object of vibration configured to provide a tactile sensation to a user by vibration of the vibration plate being transmitted to the object of vibration. The angle between the vibration plate and the support is acute.

DETAILED DESCRIPTION

First Embodiment

Figure 1:
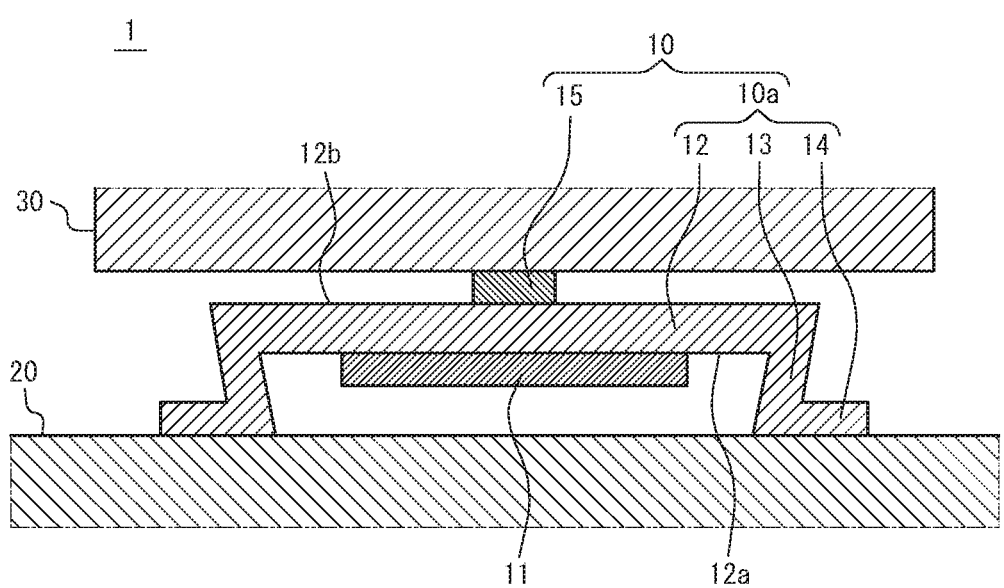
FIG. 1 is a main cross-section of an example configuration of a tactile sensation providing apparatus according to a first embodiment.

An actuator according to the present embodiment may be used in a variety of devices. A tactile sensation providing apparatus according to the present embodiment may be an on-vehicle device such as a car navigation system, a steering wheel, or a power window switch. The tactile sensation providing apparatus may also be a mobile phone, a smartphone, a tablet personal computer (PC), a notebook PC, or the like. The tactile sensation providing apparatus is not limited to these examples and may be any of a variety of electronic devices, such as a desktop PC, a household appliance, an industrial device or factory automation (FA) device, a dedicated terminal, or the like. The drawings referred to below are schematic illustrations. The dimensional ratios and the like in the drawings do not necessarily match the actual dimensions.

[Example Configuration of Tactile Sensation Providing Apparatus]

As illustrated in FIG. 1, a tactile sensation providing apparatus 1 according to the present embodiment includes an actuator 10, a housing 20, and an object of vibration 30. The actuator 10 includes a piezoelectric element 11, a vibration plate 12, supports 13, fixing portions 14, and a holder 15. The actuator 10 is joined to the housing 20 by the fixing portions 14. The actuator 10 has the object of vibration 30 joined thereto via the holder 15.

Figure 2A:
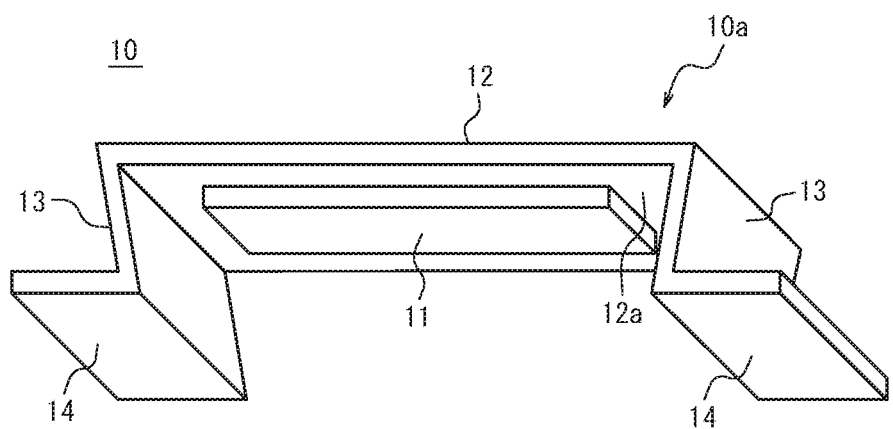
FIG. 2A is a perspective view of an example configuration of an actuator 10 from the side joined to a housing.
Figure 2B:
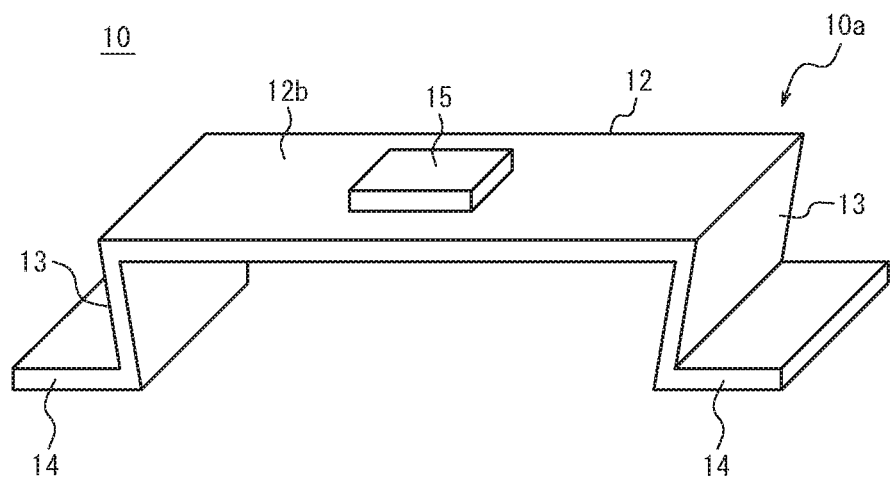
FIG. 2B is a perspective view of an example configuration of the actuator from the side joined to an object of vibration.

Each portion of the actuator 10 is described with reference to FIGS. 1, 2A, and 2B.

The piezoelectric element 11 is, for example, rectangular. The piezoelectric element 11 expands and contracts in the longitudinal direction in a variety of patterns in accordance with an applied voltage signal. The piezoelectric element 11 may have a different shape. The piezoelectric element 11 may be a piezoelectric film or piezoelectric ceramic. Piezoelectric ceramic can generate vibration having a greater vibration energy than piezoelectric film can.

The piezoelectric element 11 may be replaced with a magnetostrictor. A magnetostrictor expands and contracts in accordance with the applied magnetic field. A magnetostrictor is used together with a coil or the like that converts an applied voltage signal to a magnetic field.

The vibration plate 12 is a rectangular plate-shaped member having a predetermined thickness. The vibration plate 12 may have a different shape. The vibration plate 12 is, for example, a thin plate with elasticity. The vibration plate 12 may, for example, be made of metal, resin, or a composite material of metal, resin, and the like. The vibration plate 12 may be a thin metal plate. A thin metal plate is also referred to as a shim. The surface facing the housing 20 is also referred to as a first main surface 12a. The surface facing the object of vibration 30 is also referred to as a second main surface 12b.

The piezoelectric element 11 is provided on the first main surface 12a of the vibration plate 12. The piezoelectric element 11 is arranged so that the longitudinal direction of the piezoelectric element 11 matches the longitudinal direction of the vibration plate 12. The holder 15 is provided on the second main surface 12b of the vibration plate 12. The piezoelectric element 11 and the holder 15 are each joined to the vibration plate 12 by a method such as adhesion.

A structure in which the piezoelectric element 11 is provided on the first main surface 12a of the vibration plate 12 is known as a monomorph. In a monomorph, the expansion and contraction of the piezoelectric element 11 provokes bending vibration of the vibration plate 12. When only one end of the vibration plate 12 is supported by the housing 20, the vibration plate 12 vibrates with the amplitude in the normal direction of the first main surface 12a being maximized at the other end of the vibration plate 12. When both ends of the vibration plate 12 are supported by the housing 20, the vibration plate 12 vibrates with the amplitude in the normal direction of the first main surface 12a being maximized near the center of the vibration plate 12.

A support 13 is provided at each end of the vibration plate 12 in the longitudinal direction. The supports 13 maintain a clearance between the piezoelectric element 11 and the housing 20 to prevent the piezoelectric element 11 from hitting the housing 20 when the vibration plate 12 vibrates in accordance with displacement of the piezoelectric element 11. The supports 13 are, for example, thin plates with elasticity like the vibration plate 12. The supports 13 may be made of the same or different material as the vibration plate 12. When both ends of the vibration plate 12 are supported, the vibration plate 12 vibrates in accordance with displacement of the piezoelectric element 11, with the amplitude being maximized near the center of the vibration plate 12.

One end of each support 13 is connected to the vibration plate 12. The other end of each support 13 is connected to one of the fixing portions 14. The fixing portions 14 may, for example, be fixed to the housing 20 by screwing, adhesion, or the like. The fixing portions 14 may, for example, be thin plates with elasticity like the vibration plate 12. The fixing portions 14 may be made of the same or different material as the vibration plate 12.

In the actuator 10 according to the present embodiment, the vibration plate 12, the supports 13, and the fixing portions 14 are integrally molded. The member in which the vibration plate 12, the supports 13, and the fixing portions 14 are integrally molded is also referred to below as a frame 10a of the actuator 10. The frame 10a according to the present embodiment is entirely made of the same material. The frame 10a may, for example, be integrally molded by subjecting a thin sheet of metal to sheet-metal processing to bend the thin sheet. The frame 10a may be integrally molded by welding the vibration plate 12, the supports 13, and the fixing portions 14 together. The frame 10a may be made by integrally molding resin.

The holder 15 may, for example, be made of a rubber material. The holder 15 is not limited to a rubber material and may be made of another material, such as metal. The holder 15 is provided on the second main surface 12b side of the vibration plate 12. The holder 15 is joined to the vibration plate 12 using a method such as adhesion. The holder 15 is provided near the center on the second main surface 12b side. The position at which the holder 15 is provided is not limited to being near the center. The holder 15 may be provided at the portion where the amplitude of the vibration plate 12 is maximized. The holder 15 has the object of vibration 30 joined thereto by a method such as adhesion, for example.

The holder 15 may have a large elastic modulus in the vibration direction of the vibration plate 12, i.e. in the normal direction of the first main surface 12a, to efficiently transmit vibration of the vibration plate 12 to the object of vibration 30. On the other hand, the holder 15 may have a small elastic modulus in a direction parallel to the first main surface 12a of the vibration plate 12. This configuration can reduce the likelihood of damage to the tactile sensation providing apparatus 1 due to an external force. The elastic modulus is a constant indicating the relationship between an external force acting on a member and the amount of displacement of the member. The external force on the member corresponds to the product of the amount of displacement and the elastic modulus. In other words, the same external force produces a larger amount of displacement as the elastic modulus is smaller.

The housing 20 has the actuator 10 joined thereto by the fixing portions 14. The housing 20 has a greater mass and a higher rigidity than the actuator 10 does. In the present embodiment, the housing 20 is considered to be a rigid body. The object of vibration 30 may, for example, be a touch sensor 50 provided in a device (see FIG. 3) or a switch. The object of vibration 30 has the actuator 10 joined thereto by the holder 15. When the housing 20 is considered to be a rigid body, the vibration generated by the actuator 10 is mainly transmitted to the object of vibration 30. By the vibration being transmitted from the actuator 10 to the object of vibration 30, the object of vibration 30 can provide a tactile sensation to the user that touches the object of vibration 30.

[Example Operations of Tactile Sensation Providing Apparatus]

Figure 3:
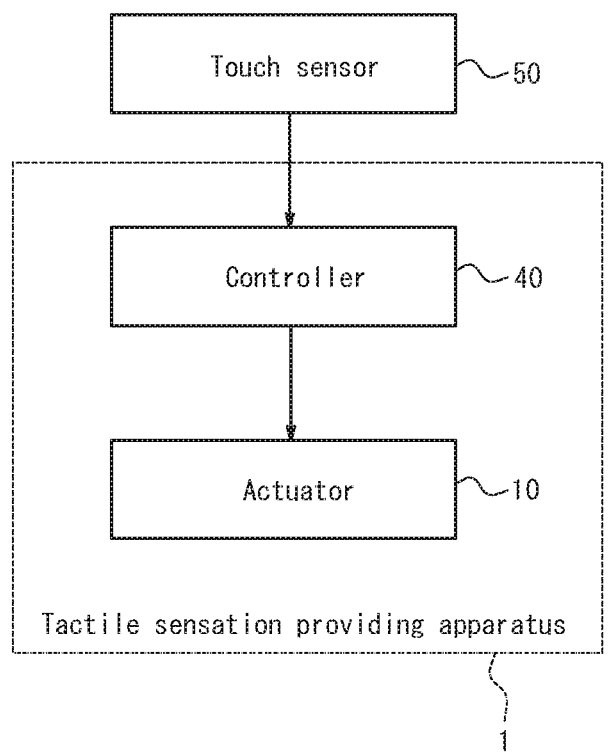
FIG. 3 is a functional block diagram illustrating an example of the schematic configuration of the tactile sensation providing apparatus according to the first embodiment.

As illustrated in FIG. 3, the tactile sensation providing apparatus 1 further includes a controller 40. The controller 40 may be constituted by a processor, microcomputer, or the like capable of executing application software. The controller 40 may appropriately include a storage unit or the like constituted by memory or the like capable of storing various information as necessary.

As illustrated in FIG. 3, the controller 40 connects to the actuator 10. The controller 40 outputs a drive signal to the actuator 10. The drive signal may be a voltage signal that is applied to the piezoelectric element 11 of the actuator 10.

The piezoelectric element 11 expands and contracts in the longitudinal direction in accordance with the drive signal acquired from the controller 40. The vibration plate 12 of the example actuator 10 illustrated in FIGS. 1, 2A, and 2B bends in accordance with displacement of the piezoelectric element 11. When the piezoelectric element 11 is displaced by contracting in the longitudinal direction of the vibration plate 12, the vibration plate 12 bends so that the second main surface 12b side becomes convex. When the piezoelectric element 11 is displaced by expanding in the longitudinal direction of the vibration plate 12, the vibration plate 12 bends so that the first main surface 12a side becomes convex. Displacement of the piezoelectric element 11 is converted into vibration in the normal direction of the first main surface 12a of the vibration plate 12.

In the present embodiment, the piezoelectric element 11 is displaced only in the contracting direction in response to application of a voltage signal. In this case, the vibration plate 12 oscillates between a state in which the second main surface 12b side is bent to become convex and a normal, straight state. The piezoelectric element 11 is not limited to being displaced in the contracting direction in response to application of a voltage signal. The piezoelectric element 11 may be configured to be displaced in the expanding direction in response to application of a voltage signal or to be displaced in both the expanding direction and the contracting direction.

In this way, the controller 40 drives the actuator 10 and vibrates the vibration plate 12. Vibration of the vibration plate 12 is transmitted to the object of vibration 30 through the holder 15. A tactile sensation is provided to the user touching the object of vibration 30 by vibration being transmitted to the object of vibration 30.

As illustrated in FIG. 3, for example, the controller 40 may connect to the touch sensor 50. In this case, the controller 40 may output a drive signal to the actuator 10 in response to a signal acquired from the touch sensor 50. The touch sensor 50 may be the object of vibration 30 of the tactile sensation providing apparatus 1. In this case, a touch by the user on the object of vibration 30 is detected by the touch sensor 50. The controller 40 vibrates the object of vibration 30 when the user is touching the object of vibration 30. This configuration allows the tactile sensation providing apparatus 1 to provide a tactile sensation to the user touching the object of vibration 30. The touch sensor 50 may be provided as a separate structure from the object of vibration 30 of the tactile sensation providing apparatus 1.

[Shape of Frame]

Figure 4A:
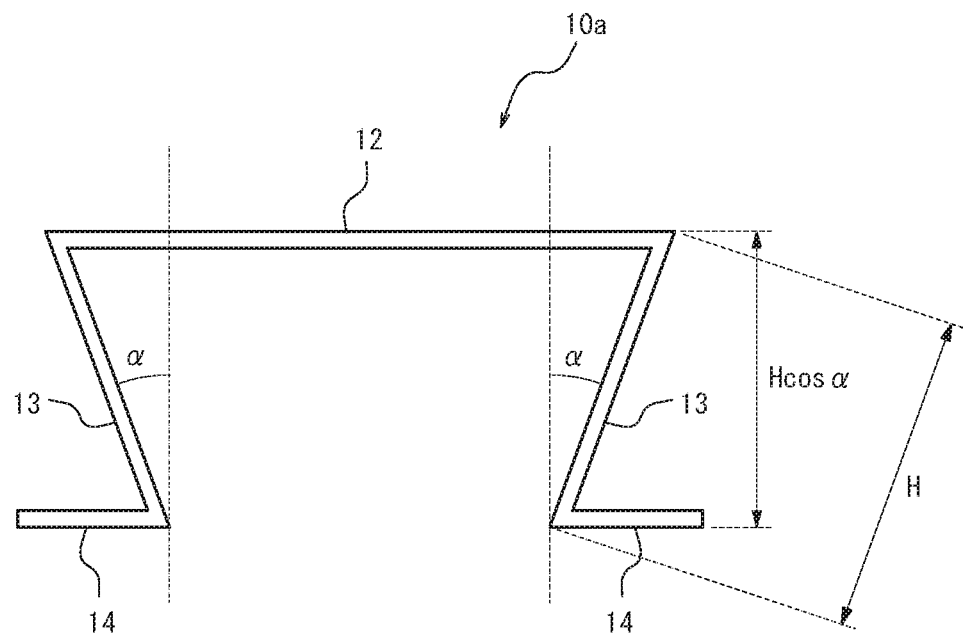
FIG. 4A illustrates an example cross-sectional shape of a frame when an actuator is not being driven.
Figure 4B:
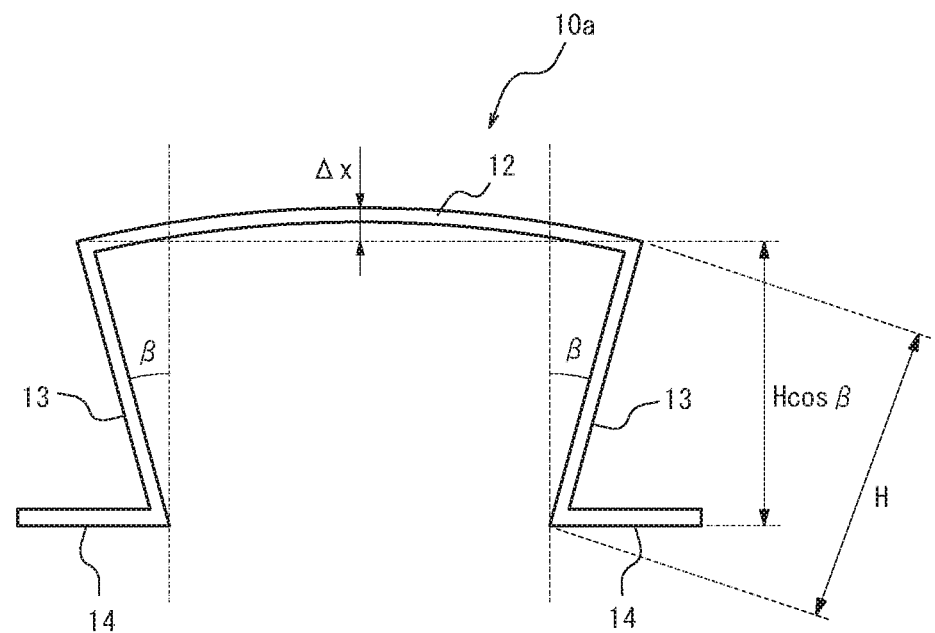
FIG. 4B illustrates an example cross-sectional shape of the frame when the actuator is being driven.

The frame 10a of the actuator 10 elastically deforms in response to driving of the actuator 10. As illustrated in FIG. 4A, the vibration plate 12 does not deform when the actuator 10 is not being driven. As illustrated in FIG. 4B, when the actuator 10 is driven, the vibration plate 12 bends in accordance with driving of the actuator 10 to become convex at the second main surface 12b side.

As illustrated in FIG. 4A, each support 13 is arranged so that when the actuator 10 is not driven, the end of the support 13 at the side connected to the vibration plate 12 is further outward than the end at the side connected to the fixing portion 14. The supports 13 arranged in this way are also referred to as being inclined outward. In this case, the angle between the vibration plate 12 and the support 13 is acute.

The support 13 is arranged so that the angle between the normal direction of the vibration plate 12 and the support 13 becomes α. The angle (α) is also referred to as a given angle (α). The given angle (α) is assumed to be a positive value when the support 13 is inclined outward relative to the normal direction of the vibration plate 12. The given angle (α) is measured in radians. Unless otherwise noted, the units of angles in the explanation below are radians. The given angle (α) is assumed to satisfy $-\pi \leq \alpha < \pi$ to uniquely represent the direction in which the support 13 is arranged.

The length of the support 13 is H. In this case, the distance between the end of the vibration plate 12 and the fixing portion 14 is H cos α. The distance between the end of the vibration plate 12 and the fixing portion 14 is assumed to be the length of a perpendicular from the end of the vibration plate 12 to a surface including the fixing portion 14.

As illustrated in FIG. 4B, the vibration plate 12 bends when the actuator 10 is being driven. The displacement of the central portion of the vibration plate 12 relative to the ends is Δx (Δx>0) assuming that the displacement from the first main surface 12a side towards the second main surface 12b side is positive. In accordance with the bending of the vibration plate 12, the upper end of the support 13 is pulled by the vibration plate 12. The upper end of the support 13 corresponds to the end on the side connected to the vibration plate 12. When the support 13 is pulled by the vibration plate 12, the angle between the normal direction of the vibration plate 12 and the support 13 becomes β. The angle (β) is also referred to as a displacement angle (β). The displacement angle (β) is assumed to be a positive value when the support 13 is inclined outward. Like the range of the given angle (α), the displacement angle (β) is assumed to satisfy $-\pi \leq \beta < \pi$. The length of the support 13 is H, as in FIG. 4A. In this case, the distance between the end of the vibration plate 12 and the fixing portion 14 is H cos β.

When comparing FIG. 4A and FIG. 4B, the change (Δy) in distance between the end of the vibration plate 12 and the fixing portion 14 due to driving of the actuator 10 is given by Equation (1) below.

$$\Delta y = H(\cos \beta - \cos \alpha) \quad (1)$$

In Equation (1), α>β>0 and H>0. Hence, Δy>0.

The displacement of the actuator 10 transmitted to the object of vibration 30 is the sum of the displacement (Δx) of the central portion of the vibration plate 12 and the change (Δy) in the distance between the end of the vibration plate 12 and the fixing portion 14. Since Δy>0, the displacement of the actuator 10 transmitted to the object of vibration 30 can be increased as compared to when the angle between the support 13 and the normal direction of the vibration plate 12 does not change (Δy=0).

Comparative Example

Figure 5A:
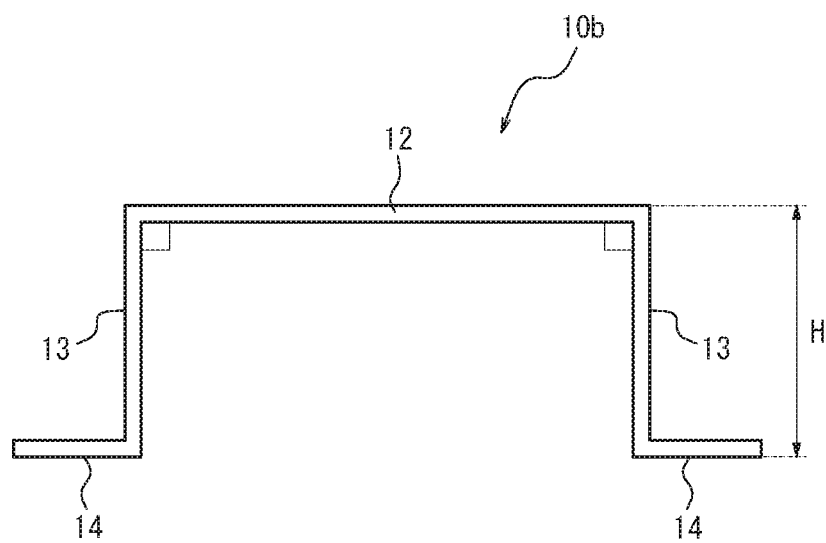
FIG. 5A illustrates a cross-sectional shape of a frame when an actuator according to a comparative example is not being driven.
Figure 5B:
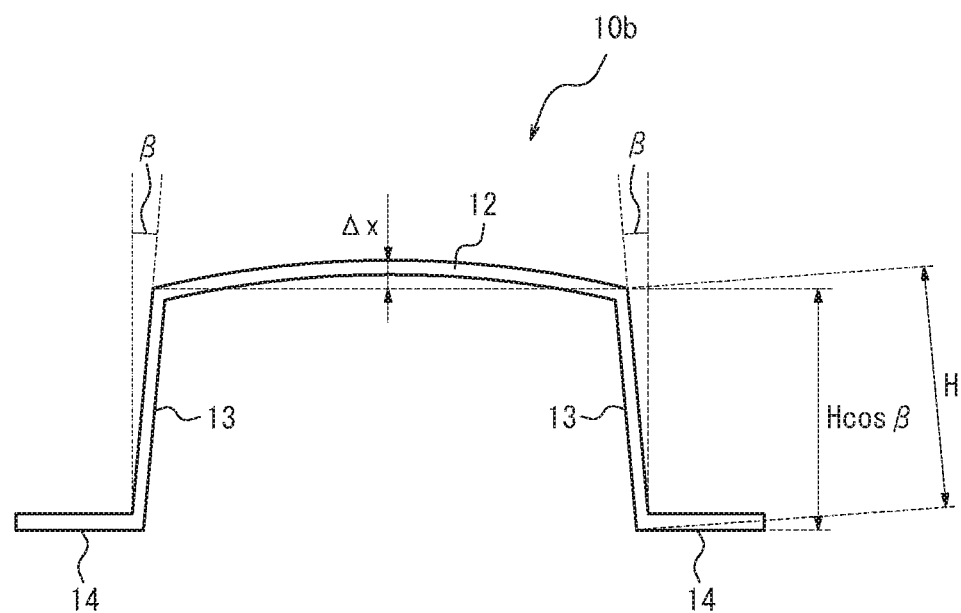
FIG. 5B illustrates the cross-sectional shape of the frame when the actuator according to the comparative example is being driven.

As illustrated in FIGS. 5A and 5B, a frame 10b of an actuator 10 according to a comparative example is a member in which a vibration plate 12, supports 13, and fixing portions 14 are integrally molded, like the frame 10a illustrated in FIG. 1 and the like. The frame 10b has a different cross-sectional shape than the frame 10a does. As illustrated in FIG. 5A, the vibration plate 12 does not deform when the actuator 10 is not being driven. As illustrated in FIG. 5B, when the actuator 10 is driven, the vibration plate 12 bends in accordance with driving of the actuator 10 to become convex at the second main surface 12b side.

As illustrated in FIG. 5A, the supports 13 of the frame 10b are arranged to lie in the normal direction of the vibration plate 12 when the actuator 10 is not being driven. In other words, the supports 13 are orthogonal to the vibration plate 12 in FIG. 5A. The length of the support 13 is H. In this case, the distance between the end of the vibration plate 12 and the fixing portion 14 is the same as the length (H) of the support 13.

As illustrated in FIG. 5B, the vibration plate 12 bends when the actuator 10 is being driven, so that the central portion of the vibration plate 12 is displaced relative to the ends by Δx at the second main surface 12b side. As in FIG. 4B, the relationship Δx>0 is satisfied assuming that the displacement from the first main surface 12a side towards the second main surface 12b is positive. In accordance with the bending of the vibration plate 12, the upper end of the support 13 is pulled by the vibration plate 12. The upper end of the support 13 corresponds to the end on the side connected to the vibration plate 12. The displacement angle of the support 13 is β. Under the above-described assumption, the relationship β>0 holds. The length of the support 13 is H, as in FIG. 4A. In this case, the distance between the end of the vibration plate 12 and the fixing portion 14 is H cos β.

When comparing FIG. 5A and FIG. 5B, the change (Δy) in distance between the end of the vibration plate 12 and the fixing portion 14 due to driving of the actuator 10 is given by Equation (2) below.

$$\Delta y = H(\cos \beta - 1) \qquad (2)$$

In Equation (2), cos β<1 and H>0. Hence, Δy<0.

The displacement of the actuator 10 transmitted to the object of vibration 30 is the sum of the displacement (Δx) of the central portion of the vibration plate 12 and the change (Δy) in the distance between the end of the vibration plate 12 and the fixing portion 14. Since Δy<0, the displacement of the actuator 10 transmitted to the object of vibration 30 is smaller than in the example (Δy>0) of the cross-sectional shape of the frame 10a according to the present embodiment. The displacement of the actuator 10 transmitted to the object of vibration 30 is also smaller than when the angle between the support 13 and the normal direction of the vibration plate 12 does not change (Δy=0).

The support 13 has a given angle (α) in the cross-sectional shape of the frame 10a according to the present embodiment. In other words, the angle between the vibration plate 12 and the support 13 is acute. The displacement of the actuator 10 transmitted to the object of vibration 30 does not increase when the angle between the vibration plate 12 and the support 13 is a right angle, as in the cross-sectional shape of the frame 10b according to the comparative example. The displacement of the actuator 10 transmitted to the object of vibration 30 does not increase when the angle between the vibration plate 12 and the support 13 is obtuse, either. The frame 10a according to the present embodiment allows an increase in the displacement of the actuator 10 transmitted to the object of vibration 30.

Second Embodiment

Figure 6:
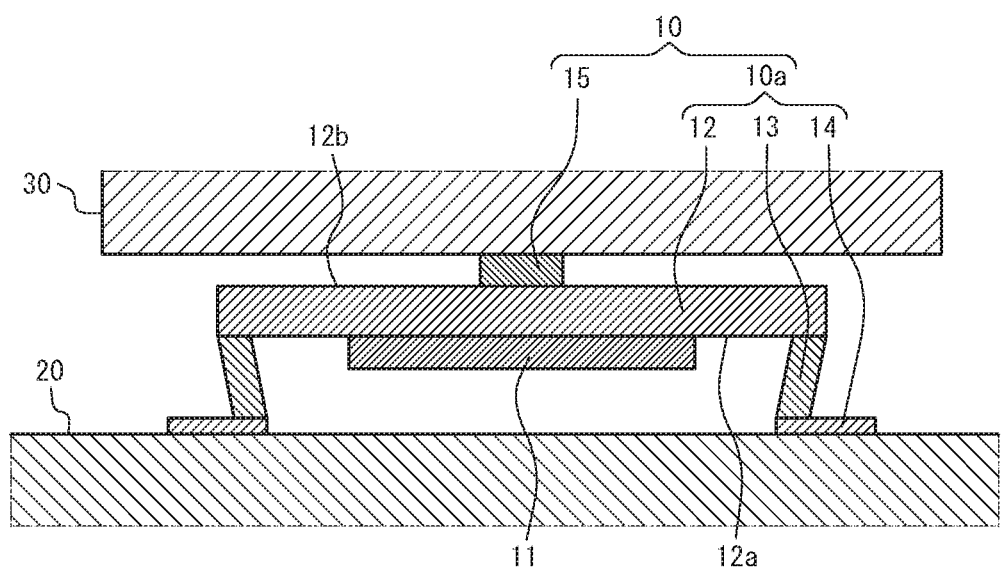
FIG. 6 is a main cross-section of an example configuration of a tactile sensation providing apparatus according to a second embodiment.

In the first embodiment, the entire frame 10a of the actuator 10 is made of the same material. In the second embodiment, the vibration plate 12 and the supports 13 are made of different materials. The configuration example of a tactile sensation providing apparatus 1 according to the second embodiment illustrated in FIG. 6 has similarities to and differences from FIG. 1. The differences from FIG. 1 are described below.

The vibration plate 12 and the fixing portions 14 of the present embodiment may, for example, be thin plates with elasticity as in the first embodiment. The material of the vibration plate 12 and the material of the fixing portions 14 may be the same or different. The supports 13 may be pillars made of curable resin, for example. The supports 13 may be members with a large elastic modulus in the normal direction of the vibration plate 12. The supports 13 may be made of another material, such as metal. The supports 13 are configured to elastically deform at the joint with the vibration plate 12 and the joint with the fixing portion 14. The supports 13 can incline by elastically deforming at these joints.

In the present embodiment, the vibration plate 12 and the supports 13 are different materials that are integrally molded together. For example, the vibration plate 12 and the supports 13 may be integrally molded by being welded together. The vibration plate 12 and the supports 13 may be integrally molded by molding resin that becomes the supports 13 around a metal vibration plate 12. The vibration plate 12 and the supports 13 may be integrally molded by engaging supports 13 made of resin with fitting portions provided in a metal vibration plate 12. The vibration plate 12 and the supports 13 may be integrally molded by applying primer to a joining face provided on a surface of a metal vibration plate 12 and molding resin onto the joining face. The vibration plate 12 and the supports 13 may be integrally molded by performing microfabrication on a joining face provided on a surface of a metal vibration plate 12 and molding resin onto the joining face.

The vibration plate 12 and the supports 13 made of different materials are integrally molded in the actuator 10 according to the second embodiment. As compared to when the vibration plate 12 and the supports 13 are configured as separate components, the second embodiment allows a reduction in the number of components and assembly steps while the supports 13 reduce attenuation of the vibration of the vibration plate 12 generated in accordance with displacement of the piezoelectric element 11. Not using adhesive between the vibration plate 12 and the supports 13 can lengthen the mean time between failure (MTBF) and improve the yield at the time of assembly.

As in the first embodiment, the angle between the vibration plate 12 and the support 13 is acute in the actuator 10 according to the second embodiment. The displacement of the actuator 10 transmitted to the object of vibration 30 can be further increased as compared to when the angle between the vibration plate 12 and the support 13 is not acute.

Other Embodiments

Figure 7A:
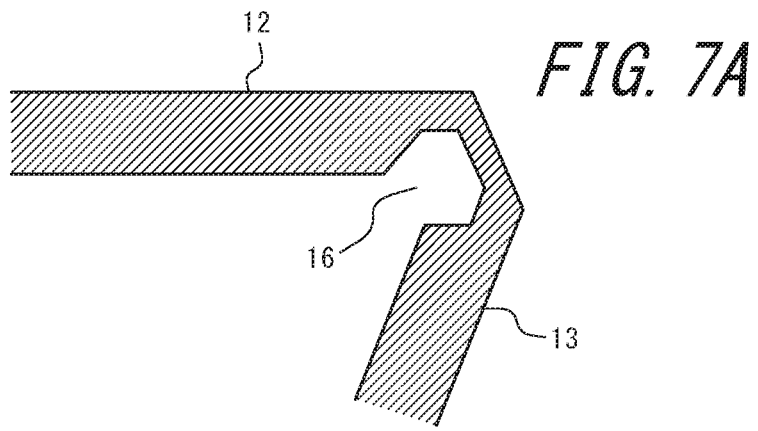
FIG. 7A illustrates an example cross-sectional shape of a joint between a vibration plate and a support.
Figure 7B:
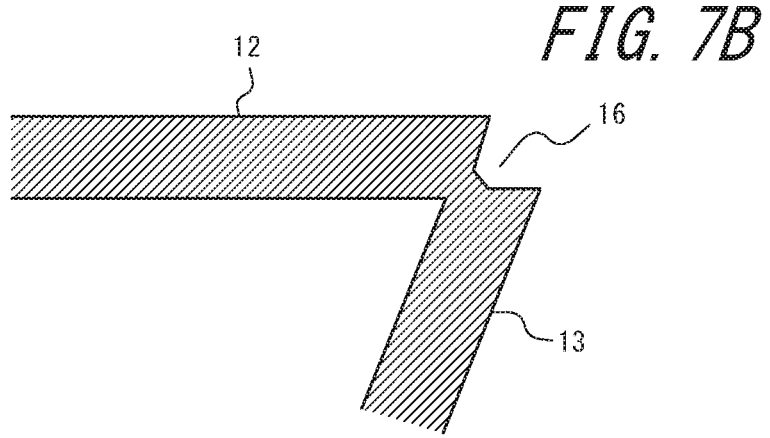
FIG. 7B illustrates an example cross-sectional shape of a joint between a vibration plate and a support.
Figure 7C:
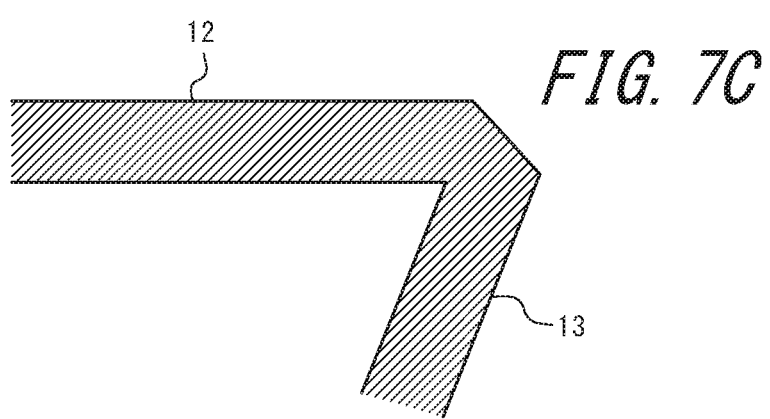
FIG. 7C illustrates an example cross-sectional shape of a joint between a vibration plate and a support.

A notch 16 may be provided at the inside of the joint, as illustrated in FIG. 7A. The inside of the joint corresponds to the side that connects to the first main surface 12a of the vibration plate 12. A notch 16 may be provided at the outside of the joint, as illustrated in FIG. 7B. The outside of the joint corresponds to the side that connects to the second main surface 12b of the vibration plate 12. FIG. 7C illustrates a comparative example in which a notch 16 is not provided on the inside or the outside of the joint.

The joint between the vibration plate 12 and the support 13 in FIGS. 7A and 7B bends more easily than the example illustrated in FIG. 7C by virtue of the notch 16 being provided. By the joint bending more easily, the upper portion of the support 13 is pulled towards the vibration plate 12 more easily. This prevents bending of the vibration plate 12 from being impeded when the actuator 10 is driven.

The notch 16 illustrated in FIGS. 7A and 7B may be provided in the joint between the support 13 and the fixing portion 14. This configuration can increase the difference between the given angle (α) and the displacement angle (β) of the support 13.

Figure 8A:
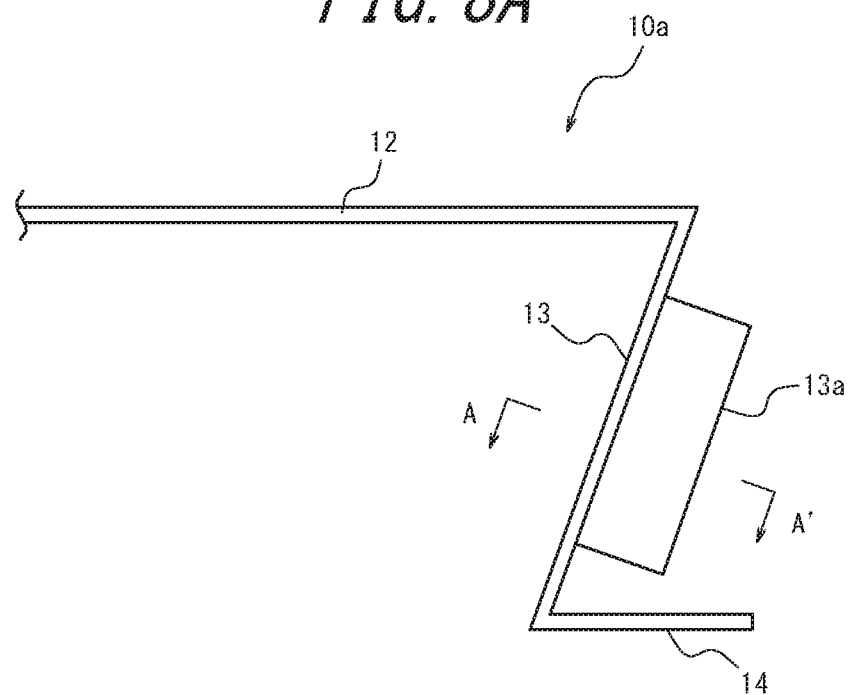
FIG. 8A illustrates an example cross-sectional shape of a frame in which a rib is provided in a support.
Figure 8B:
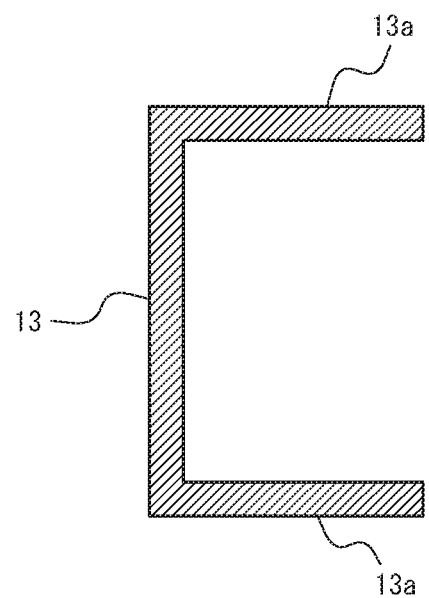
FIG. 8B is a cross-section along the A-A line in FIG. 8A.

As illustrated in FIGS. 8A and 8B, a rib 13a may be provided on the support 13. Provision of the rib 13a in the support 13 as illustrated in FIG. 8B increases the rigidity of the support 13 relative to the normal direction of the vibration plate 12. In other words, this configuration reduces the amount of deformation of the support 13 due to the force acting on the support 13 as a reaction to the force that the actuator 10 exerts on the object of vibration 30. The vibration generated by the actuator 10 thus tends to be absorbed less at the support 13 side. Consequently, the vibration generated by the actuator 10 can be transmitted more efficiently to the object of vibration 30.

As illustrated in FIGS. 7A, 7B, 8A, and 8B, the supports 13 may be configured so that the ends of the vibration plate 12 are displaced more in the longitudinal direction than in the normal direction of the vibration plate 12 in accordance with expansion and contraction of the piezoelectric element 11. When the supports 13 are configured for smaller displacement of the ends of the vibration plate 12 in the normal direction of the vibration plate 12, the vibration of the vibration plate 12 is efficiently transmitted to the object of vibration 30. When the supports 13 are configured for greater displacement of the ends of the vibration plate 12 in the longitudinal direction of the vibration plate 12, attenuation of the vibration of the vibration plate 12 is reduced.

Figure 9A:
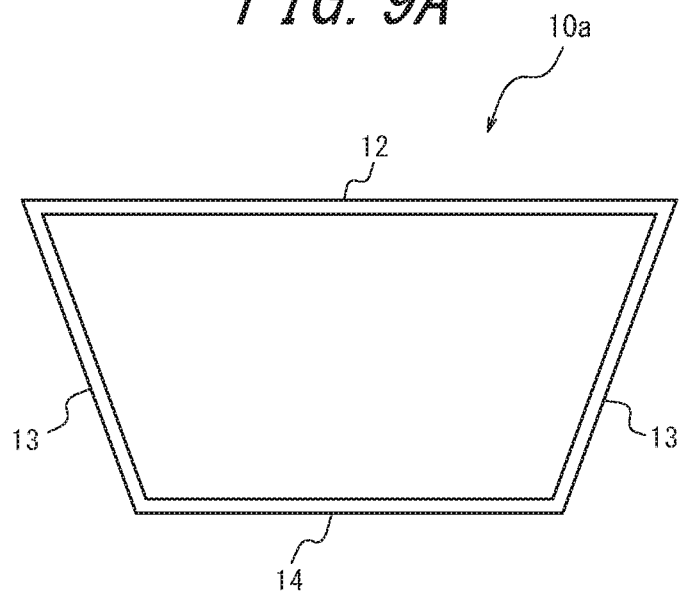
FIG. 9A is a cross-section of an example frame in which fixing portions at either side are bent inward and connected.
Figure 9B:
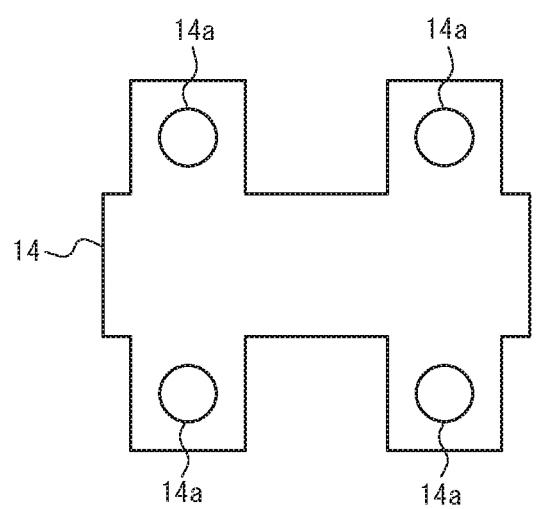
FIG. 9B is a plan view of an example frame in which fixing portions at either side are bent inward and connected.

As illustrated in FIGS. 9A and 9B, the frame 10a may be configured so that the fixing portions 14 at either side connect with each other by being bent inward. The cross-sectional shape of the frame 10a becomes trapezoidal as a result of the fixing portions 14 being connected as in FIG. 9A. Consequently, the frame 10a becomes stronger. In FIG. 9B, screw holes 14a are provided beside the fixing portions 14. Provision of the screw holes 14a facilitates screwing of the fixing portions 14 to the housing 20.

(Example of Calculating Displacement)

Figure 10A:
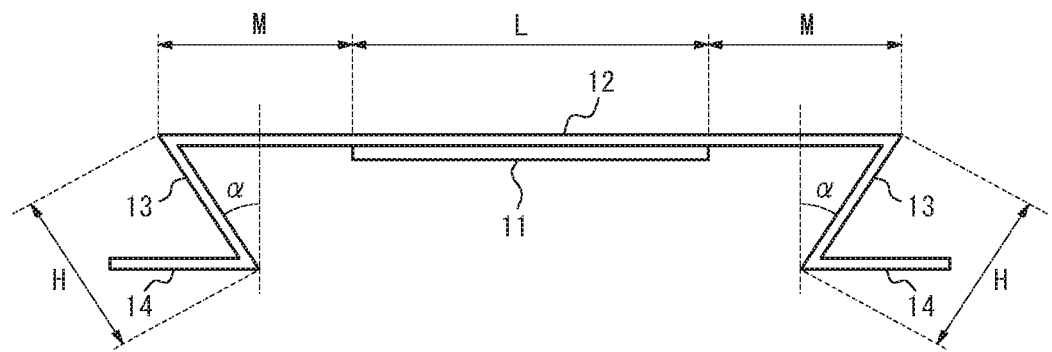
FIG. 10A illustrates example dimensions of each part when an actuator is not being driven.
Figure 10B:
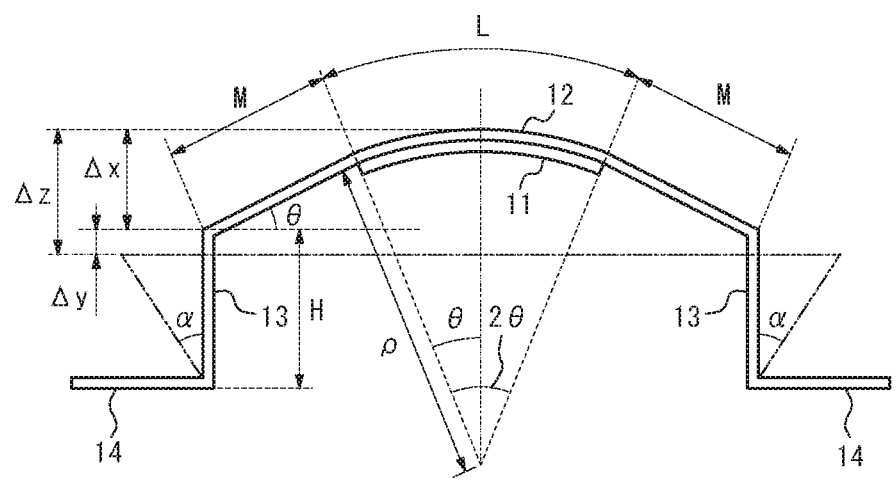
FIG. 10B illustrates example dimensions of each part when an actuator is being driven.

With reference to FIGS. 10A and 10B, an example of the method for calculating the displacement of the central portion of the vibration plate 12 when the actuator 10 is driven is described.

FIG. 10A illustrates example dimensions of each part when the actuator 10 is not being driven. The longitudinal dimension of the piezoelectric element 11 is L. The piezoelectric element 11 is disposed at a distance (M) from each end of the vibration plate 12. The longitudinal dimension of the vibration plate 12 is L+2M. The length of the support 13 is H. The angle (given angle) formed by the support 13 and the normal direction of the vibration plate 12 is $\alpha$. The ends of the supports 13 connected to the fixing portions 14 are fixed by the fixing portions 14. The supports 13 are pivotable about the ends of the supports 13.

FIG. 10B illustrates example dimensions of each part when the actuator 10 is being driven. As a result of contraction of the piezoelectric element 11, the vibration plate 12 bends to become convex at the side of the second main surface 12b (see FIG. 1). The shape of the vibration plate 12 and the support 13 when the actuator 10 is not being driven is indicated in FIG. 10B by dashed double-dotted lines. The displacement ($\Delta$x) of the central portion of the vibration plate 12 relative to the ends, which correspond to the joints between the vibration plate 12 and the supports 13, is given by Equation (3) below.

$$\Delta x = M \sin\theta + \rho(1-\cos\theta) \quad (3)$$

In Equation (3), $\rho$ is the radius of curvature when the vibration plate 12 bends, and $\theta$ is the difference in the angle between the bent state and the unbent state at the ends of the vibration plate 12. The interior angle of the bent portion of the vibration plate 12, i.e. the interior angle of the sector having the bent portion as an arc, is expressed as $2\theta$. The radius of curvature ($\rho$) and the interior angle ($2\theta$) are determined by factors such as the amount of displacement of the piezoelectric element 11 or the ratio between the thickness of the piezoelectric element 11 and the thickness of the vibration plate 12.

When the radius of curvature ($\rho$) or the interior angle ($2\theta$) of the bent portion is known, the displacement angle ($\beta$) of the support 13 can be calculated with Equation (4) below.

$$\beta = \alpha - M(1-\cos\theta)/H \quad (4)$$

Here, an approximation based on a Taylor expansion of a trigonometric function is used, taking $\alpha$, $\beta$, and $\theta$ to be minute values. By the approximation, the relationships $\sin\alpha \approx \alpha$, $\sin\beta \approx \beta$, $\sin\theta \approx \theta$, and $\sin\theta \approx L/2\rho$ hold.

When the support 13 is parallel to the normal direction of the vibration plate 12, the displacement angle ($\beta$) of the support 13 becomes 0 in accordance with the radius of curvature ($\rho$) and the interior angle ($2\theta$). When $\beta=0$ in Equation (4), the given angle ($\alpha$) satisfies the relationship in Equation (5) below.

$$\alpha = M(1-\cos\theta)/H \quad (5)$$

In FIG. 10B, bending of the vibration plate 12 causes the supports 13 to become parallel to the normal direction of the vibration plate 12 when the actuator 10 is not driven. In this case, the change ($\Delta$y) in the distance between the end of the vibration plate 12 and the fixing portion 14 is given by Equation (6) below.

$$\Delta y = H(1-\cos\theta) \quad (6)$$

The displacement ($\Delta$z) of the central portion of the vibration plate 12 is the sum of $\Delta$x and $\Delta$y. Accordingly, the displacement ($\Delta$z) of the central portion of the vibration plate 12 illustrated in FIG. 10B is given by Equation (7) below, which is based on Equation (3) and Equation (6).

$$\Delta z = M \sin\theta + \rho(1-\cos\theta) + H(1-\cos\theta) \quad (7)$$

On the basis of Equation (1), the relationship $\Delta y > 0$ is satisfied when the given angle ($\alpha$) and the displacement angle ($\beta$) satisfy the relationship $\cos\alpha < \cos\beta$. Here, the relationship $\alpha > \beta$ is satisfied in the actuator 10 according to the first embodiment and the like. Hence, $\Delta y > 0$ if $\beta \geq 0$. It follows that Equation (8) below represents a sufficient condition on the given angle ($\alpha$) for the relationship $\Delta y > 0$ to be satisfied.

$$\alpha \geq M(1-\cos\theta)/H \quad (8)$$

Accordingly, an appropriate setting of the given angle ($\alpha$) of the support 13 to satisfy Equation (8) can increase the amplitude of the central portion of the vibration plate 12.

The tactile sensation providing apparatus 1 and the actuator 10 according to the present embodiment can increase the generated vibration.

Although embodiments of the present disclosure have been described through drawings and examples, it is to be noted that various changes and modifications will be apparent to those skilled in the art on the basis of the present disclosure. Therefore, such changes and modifications are to be understood as included within the scope of the present disclosure.

The invention claimed is:

1. An actuator comprising:
    a piezoelectric element;
    a vibration plate that has the piezoelectric element joined thereto and is configured to vibrate in accordance with displacement of the piezoelectric element; and
    a support configured to support the vibration plate;
    wherein an angle, when the actuator is not being driven, between the vibration plate and the support is acute.
2. The actuator of claim 1, wherein the vibration plate and the support are integrally molded.

3. The actuator of claim 2, wherein the support is configured so that an end of the vibration plate is displaced more in a longitudinal direction than in a normal direction of the vibration plate in accordance with displacement of the piezoelectric element.

4. The actuator of claim 1, wherein the support is configured so that an end of the vibration plate is displaced more in a longitudinal direction than in a normal direction of the vibration plate in accordance with displacement of the piezoelectric element.

5. A tactile sensation providing apparatus comprising:
an actuator comprising:
  a piezoelectric element;
  a vibration plate that has the piezoelectric element joined thereto and is configured to vibrate in accordance with displacement of the piezoelectric element; and
  a support configured to support the vibration plate; and
an object of vibration configured to provide a tactile sensation to a user by vibration of the vibration plate being transmitted to the object of vibration;
wherein an angle, when the actuator is not being driven, between the vibration plate and the support is acute.

6. The tactile sensation providing apparatus of claim 5, wherein the vibration plate and the support are integrally molded.

7. The tactile sensation providing apparatus of claim 6, wherein the support is configured so that an end of the vibration plate is displaced more in a longitudinal direction than in a normal direction of the vibration plate in accordance with displacement of the piezoelectric element.

8. The tactile sensation providing apparatus of claim 5, wherein the support is configured so that an end of the vibration plate is displaced more in a longitudinal direction than in a normal direction of the vibration plate in accordance with displacement of the piezoelectric element.

* * * * *